United States Patent
Cirkic et al.

(10) Patent No.: US 11,233,532 B2
(45) Date of Patent: Jan. 25, 2022

(54) INFORMATION DECODER FOR POLAR CODES

(71) Applicant: Telefonaktiebolaget LM Ericsson (publ), Stockholm (SE)

(72) Inventors: Mirsad Cirkic, Linköping (SE); Niclas Wiberg, Linköping (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 16/975,237

(22) PCT Filed: Mar. 15, 2018

(86) PCT No.: PCT/EP2018/056604
§ 371 (c)(1),
(2) Date: Aug. 24, 2020

(87) PCT Pub. No.: WO2019/174739
PCT Pub. Date: Sep. 19, 2019

(65) Prior Publication Data
US 2020/0403644 A1    Dec. 24, 2020

(51) Int. Cl.
*H03M 13/00* (2006.01)
*H03M 13/39* (2006.01)
*H03M 13/13* (2006.01)

(52) U.S. Cl.
CPC ....... *H03M 13/3977* (2013.01); *H03M 13/13* (2013.01)

(58) Field of Classification Search
None
See application file for complete search history.

(56) References Cited

U.S. PATENT DOCUMENTS

2006/0069980 A1*  3/2006  Tzannes ............. H03M 13/096
                                                                714/781
2014/0173376 A1*  6/2014  Jeong ................. H04L 1/0041
                                                                714/755

(Continued)

FOREIGN PATENT DOCUMENTS

WO    2017186307 A1    11/2017

OTHER PUBLICATIONS

Cao, C. et al., "Low Complexity List Successive Cancellation Decoding of Polar Codes", IET Communications, vol. 8 No. 17, Nov. 27, 2014, pp. 3145-3149, IEEE.

(Continued)

*Primary Examiner* — Mujtaba M Chaudry
(74) *Attorney, Agent, or Firm* — Coats & Bennett, PLLC

(57) ABSTRACT

There is provided mechanisms for decoding an encoded sequence into a decoded sequence. A method is performed by an information decoder. The method comprises obtaining the encoded sequence. The encoded sequence has been encoded using a polar code. The method comprises successively decoding the encoded sequence into the decoded sequence. The decoding is performed for a given list size, LS, where LS>1, defining how many candidate decoded sequences in total the thus far decoded sequence is allowed to branch into during the decoding. The encoded sequence is decoded, until its first branching, by at least as many processing units in parallel as a factor, f, of the given list size. The factor is at least half the given list size, f≥LS/2.

20 Claims, 6 Drawing Sheets

(56) References Cited

U.S. PATENT DOCUMENTS

| | | | | |
|---|---|---|---|---|
| 2015/0026543 | A1* | 1/2015 | Li | H03M 13/45 |
| | | | | 714/776 |
| 2016/0013810 | A1* | 1/2016 | Gross | H03M 13/13 |
| | | | | 714/776 |
| 2017/0230059 | A1* | 8/2017 | Giard | H03M 13/2927 |
| 2018/0248564 | A1* | 8/2018 | Kim | H03M 13/09 |

OTHER PUBLICATIONS

Che, T. et al., "Overlapped List Successive Cancellation Approach for Hardware Efficient Polar Code Decoder", 2016 IEEE International Symposium on Circuits and Systems (ISCAS), May 22, 2016, pp. 2463-2466, IEEE.

Balatsoukas-Stimming, A. et al., "Hardware Architecture for List Successive Cancellation Decoding of Polar Codes", IEEE Transactions on Circuits and Systems—II: Express Briefs, vol. 61 No. 8, Aug. 1, 2014, pp. 609-613, IEEE.

Zhang, C. et al., "Low-Latency Sequential and Over-Lapped Architectures for Successive Cancellation Polar Decoder", IEEE Transactions on Signal Processing, vol. 61 No. 10, May 15, 2013, pp. 2429-2441, IEEE.

Arikan, E., "Channel Polarization: A Method for Constructing Capacity-Achieving Codes for Symmetric Binary-Input Memoryless Channels", IEEE Transactions on Information Theory, vol. 55 No. 7, Jul. 1, 2009, pp. 3051-3073, IEEE.

Tal, I. et al., "List Decoding of Polar Codes", IEEE Transactions on Information Theory, vol. 61 No. 5, May 1, 2015, pp. 2213-2226, IEEE.

* cited by examiner

INFORMATION DECODER FOR POLAR CODES

TECHNICAL FIELD

Embodiments presented herein relate to a method, an information decoder, a computer program, and a computer program product for decoding an encoded sequence into a decoded sequence.

BACKGROUND

In communications networks, there may be a challenge to obtain good performance and capacity for a given communications protocol, its parameters and the physical environment in which the communications network is deployed.

For example, in digital communication the data to be communicated from a sender to a receiver can be divided into smaller data segments which are sent in packets. These data segments are provided with information of how the data protocol used for transferring the data from the sender to the receiver should map the packets and, in some cases, analyze if the data content of the packet is correct or not. This information can typically be predicted or known by the receiver. For example when using the Internet Protocol (IP), IP-packet headers are needed for each device along the way from the sender to the receiver to route the packet. In some communications networks, such as in Long Term Evolution (LTE) radio access networks, a served wireless device will typically never receive an IP-packet with the wrong IP-address (which is exploited by so-called header-compression).

Polar codes, as presented in "Channel polarization: A method for constructing capacity-achieving codes for symmetric binary-input memoryless channels," IEEE Trans. Inform. Theory, vol. 55, pp. 3051-3073, 2009, are capacity achieving codes, have an explicit construction (i.e., not randomly generated), and have an efficient encoding and decoding algorithm. Apart from the capacity achieving property, which is valid when code-lengths tend to infinity, they have shown good performance for shorter code-lengths.

One issue with existing mechanisms for decoding polar codes lies in the successive decoding (SD) procedure which follows the bit-order of the polar codes. Decoding of polar codes is prone to error propagation and hence, an error made early in the successive decoding procedure will not be corrected, but will instead propagate all the way to the end of the decoding. This will result in a decoding error. Additionally it is more likely to make an error early in the procedure than at the end, see FIG. 2. FIG. 2 shows an example of the amount of information for a bit with index i (for i=1, 2, . . . N where N is the total number of binary digits, and N=1024 in the example) can carry, given that all the previous binary digits 1, 2, . . . , i–1 are known, i.e., where the polar code decoding order is followed.

According to "List decoding of polar codes" by I. Tal and A Vardy, arXiv: 1206.0050, 31 May 2012, a procedure that splits the paths in a binary tree is proposed. The technique keeps track of the most probable paths currently known and disregards the rest. Splitting paths is commonly referred to as branching.

Typically, procedures that use branching with a limited amount of allowed candidate branches and whose criterion for branching is based on a metric that is computed on-the-fly (i.e. not known a priori) are difficult to parallelize. This is especially eminent in traditional list decoding since at each bit a comparison between the candidate branches (where each candidate branch represents a separate process) is required. Metrics need to be communicated between the different branches (thus between the different processes), which creates dependencies between processes performed in parallel. Dependencies between parallel processes might cause computations to stall and might therefore limit the parallelization gain significantly.

In international patent application PCT/EP2016/059656, the branching criterion is process-independent, but not at the positions where branching is performed (whose number is equal to $\log_2(\text{list-size})$). This requires much less communication between processes as compared to traditional list decoding, which requires communication at every bit-position. For a code of length 128 and a list size of 8, the number of communication points reduces from 128 to $\log_2(8)=3$. However, the data amount that needs to be communicated from one process to another can still be rather large since it consists of the partial candidate that has been decoded so far at the branching point.

Hence, there is still a need for improved mechanisms for decoding data having been encoded using polar codes.

SUMMARY

An object of embodiments herein is to provide efficient decoding of polar codes that does not suffer from the issues noted above, or at least where these issues are mitigated or reduced.

According to a first aspect there is presented a method for decoding an encoded sequence into a decoded sequence. The method is performed by an information decoder. The method comprises obtaining the encoded sequence. The encoded sequence has been encoded using a polar code. The method comprises successively decoding the encoded sequence into the decoded sequence. The decoding is performed for a given list size, LS, where LS>1, defining how many candidate decoded sequences in total the thus far decoded sequence is allowed to branch into during the decoding. The encoded sequence is decoded, until its first branching, by at least as many processing units in parallel as a factor, f, of the given list size. The factor is at least half the given list size, that is f≥LS/2.

According to a second aspect there is presented an information decoder for decoding an encoded sequence into a decoded sequence. The information decoder comprises processing circuitry. The processing circuitry is configured to cause the information decoder to obtain the encoded sequence. The encoded sequence has been encoded using a polar code. The processing circuitry is configured to cause the information decoder to successively decode the encoded sequence into the decoded sequence. The decoding is performed for a given list size, LS, where LS>1, defining how many candidate decoded sequences in total the thus far decoded sequence is allowed to branch into during the decoding. The encoded sequence is decoded, until its first branching, by at least as many processing units in parallel as a factor, f, of the given list size. The factor is at least half the given list size, that is f≥LS/2.

According to a third aspect there is presented an information decoder for decoding an encoded sequence into a decoded sequence. The information decoder comprises an obtain module configured to obtain the encoded sequence. The encoded sequence has been encoded using a polar code. The information decoder comprises a decode module configured to successively decoding the encoded sequence into the decoded sequence. The decoding is performed for a given list size, LS, where LS>1, defining how many candidate decoded sequences in total the thus far decoded sequence is allowed to branch into during the decoding. The encoded sequence is decoded, until its first branching, by at least as many processing units in parallel as a factor, f, of the given list size. The factor is at least half the given list size, that is f≥LS/2.

Advantageously this provides efficient decoding of a sequence having been encoded using a polar code into a decoded sequence.

Advantageously this enables more computationally efficient decoding to be performed than for the decoding methods disclosed in the background section.

Advantageously this enables independent parallel processes to be used.

Advantageously this enables much higher parallelization gains to be harvested than for the decoding methods disclosed in the background section.

According to a fourth aspect there is presented a computer program for decoding an encoded sequence into a decoded sequence, the computer program comprising computer program code which, when run on an information decoder, causes the information decoder to perform a method according to the first aspect.

According to a fifth aspect there is presented a computer program product comprising a computer program according to the fourth aspect and a computer readable storage medium on which the computer program is stored. The computer readable storage medium could be a non-transitory computer readable storage medium.

Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, module, step, etc." are to be interpreted openly as referring to at least one instance of the element, apparatus, component, means, module, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

Figure 1:
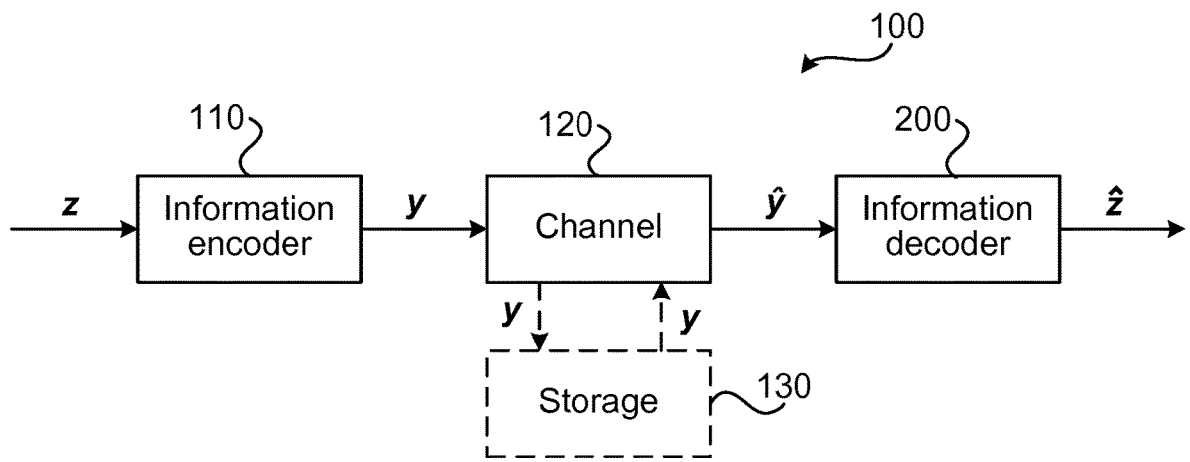
FIG. 1 is a schematic diagram illustrating a communications network according to embodiments.
Figure 2:
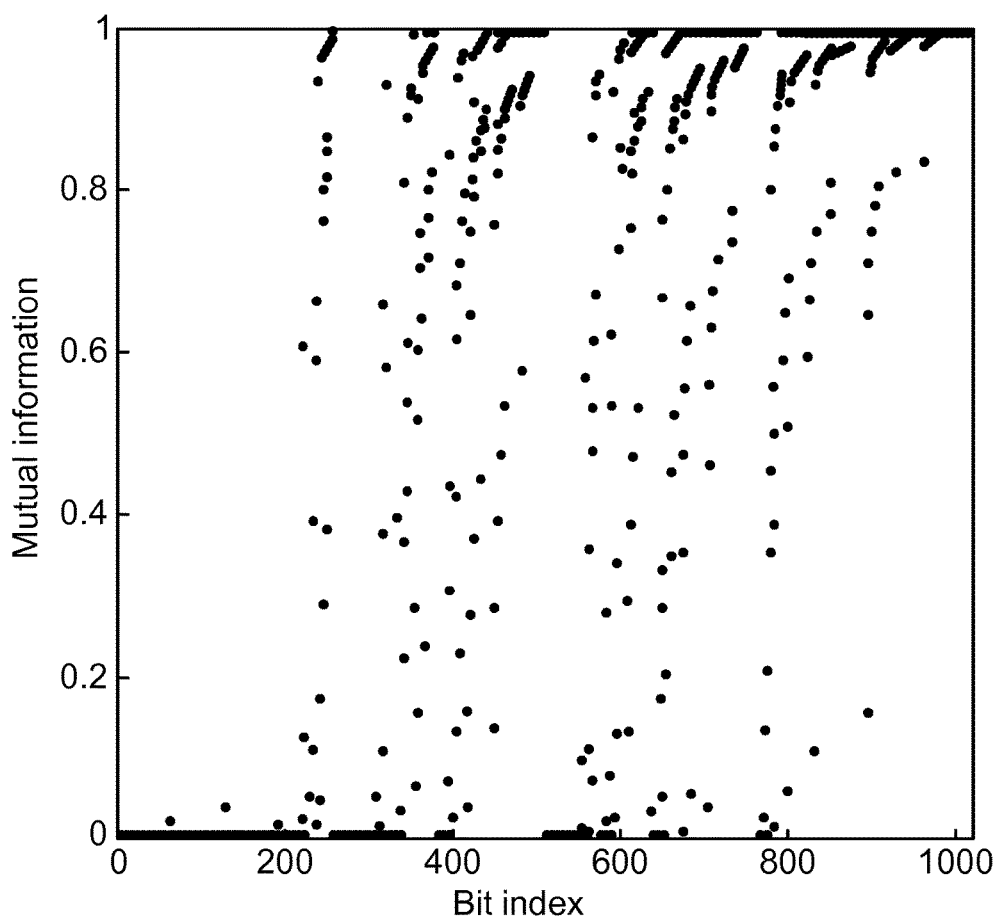
FIG. 2 is a schematic diagram illustrating mutual information according to an embodiment.

FIG. 1 is a schematic diagram illustrating a communications network 100 where embodiments presented herein can be applied. The communications network 100 comprises an information encoder 110 and an information decoder 200. The information encoder 110 is configured to encode an information sequence $z=z_1, z_2, z_3, \ldots, z_N$ into an encoded sequence y. The information decoder 200 is configured to decode an encoded sequence $\hat{y}$ into a decoded sequence $\hat{z}$.

The information encoder 110 and the information decoder 200 are separated by a symbolic communications channel 120. The communications channel 120 models how the encoded sequence y is affected between the information encoder 110 and the information decoder 200. For example, the transmission of the encoded sequence y may cause errors to be inserted in the encoded sequence y. Here, and error is to be interpreted as a bit-value in the encoded sequence y being flipped from a binary zero to a binary one, or vice versa, during transmission over the communications channel 120. Therefore the encoded sequence y as obtained by the information decoder 200 is denoted $\hat{y}$, where $\hat{y}=y$ if the channel is error-free and $\hat{y} \neq y$ elsewhere. Further, if $\hat{y}=y$ then also $\hat{z}=z$, but if $\hat{y} \neq y$ there is a non-zero probability that $\hat{z} \neq z$. In order to minimize the probability that $\hat{z} \neq z$ the information encoder 110 during the encoding procedure adds redundancy to the information sequence z in a controlled manner, resulting in the encoded sequence y. The redundancy is added in the controlled manner by using a polar code. Conversely, at the information decoder 200 the added redundancy is removed from the received encoded sequence $\hat{y}$ in a controlled manner, resulting in the decoded sequence $\hat{z}$. Further, the communications network 100 comprises a (optional) data storage 130. The data storage 130 is assumed to store data losslessly, i.e., without introducing losses in the stored data. Any losses in the data are modelled by the communications channel 120.

The information encoder 110 and the information decoder 200 use a polar code to protect the information sequence z against channel distortions. The information encoder 110 will encode the information sequence z using a predetermined polar code into the encoded sequence y which will then be used in a transmission over the communications channel 120. The received encoded sequence $\hat{y}$, which, as disclosed above, can be distorted when passing through the communications channel 120, will be decoded by the information decoder 200 using a polar code successive decoder.

Figure 3:
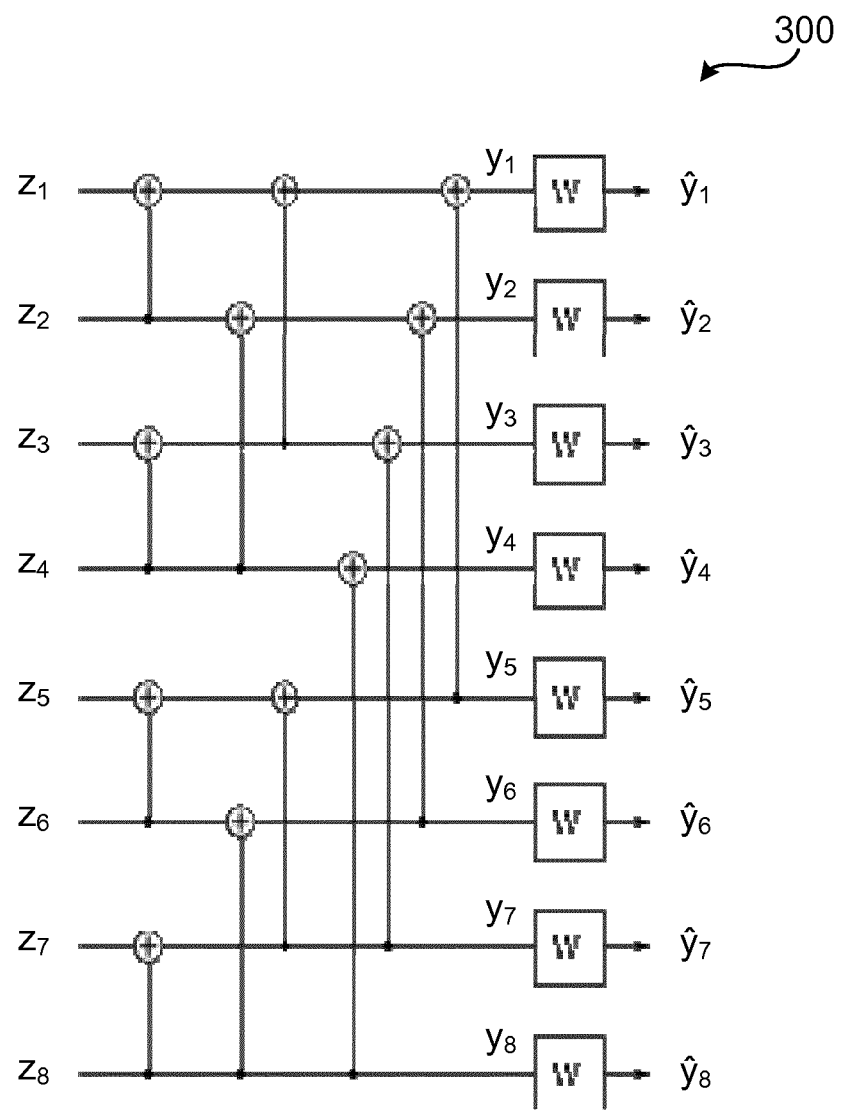
FIG. 3 is a schematic diagram illustrating a polar code.

FIG. 3 is a schematic diagram illustrating a polar code 300, where w represents the communications channel 120. In the example of FIG. 3, some of $z_1, z_2, z_3, \ldots, z_N$ represents information bits and the rest of $z_1, z_2, z_3, \ldots,$ $z_N$ represents added redundancy bits (having fixed, and thus known, values). Using the polar code example in FIG. 3, the information decoder 200, based on the received encoded sequence ŷ, estimates the probabilities of the encoded sequence y and then propagates these backwards throughout the polar code structure to calculate the probabilities of the information sequence z. The decision made on $z_1$ based on the calculated probability is propagated downwards when the probabilities of $z_2, z_3, \ldots, z_N$ are evaluated. The same is repeated for $z_2$ and so on, which defines the underlying successive decoding procedure. The better the information decoder 200 is, i.e., the more errors in the received encoded sequence ŷ it can correct, the more information can be conveyed over the communication channel w.

As disclosed above, there is a need for improved mechanisms for decoding data having been encoded using polar codes 300.

The embodiments disclosed herein therefore relate to mechanisms for decoding an encoded sequence ŷ into a decoded sequence ẑ. In order to obtain such mechanisms there is provided an information decoder 200, a method performed by the information decoder 200, a computer program product comprising code, for example in the form of a computer program, that when run on an information decoder 200, causes the information decoder 200 to perform the method.

Figure 4:
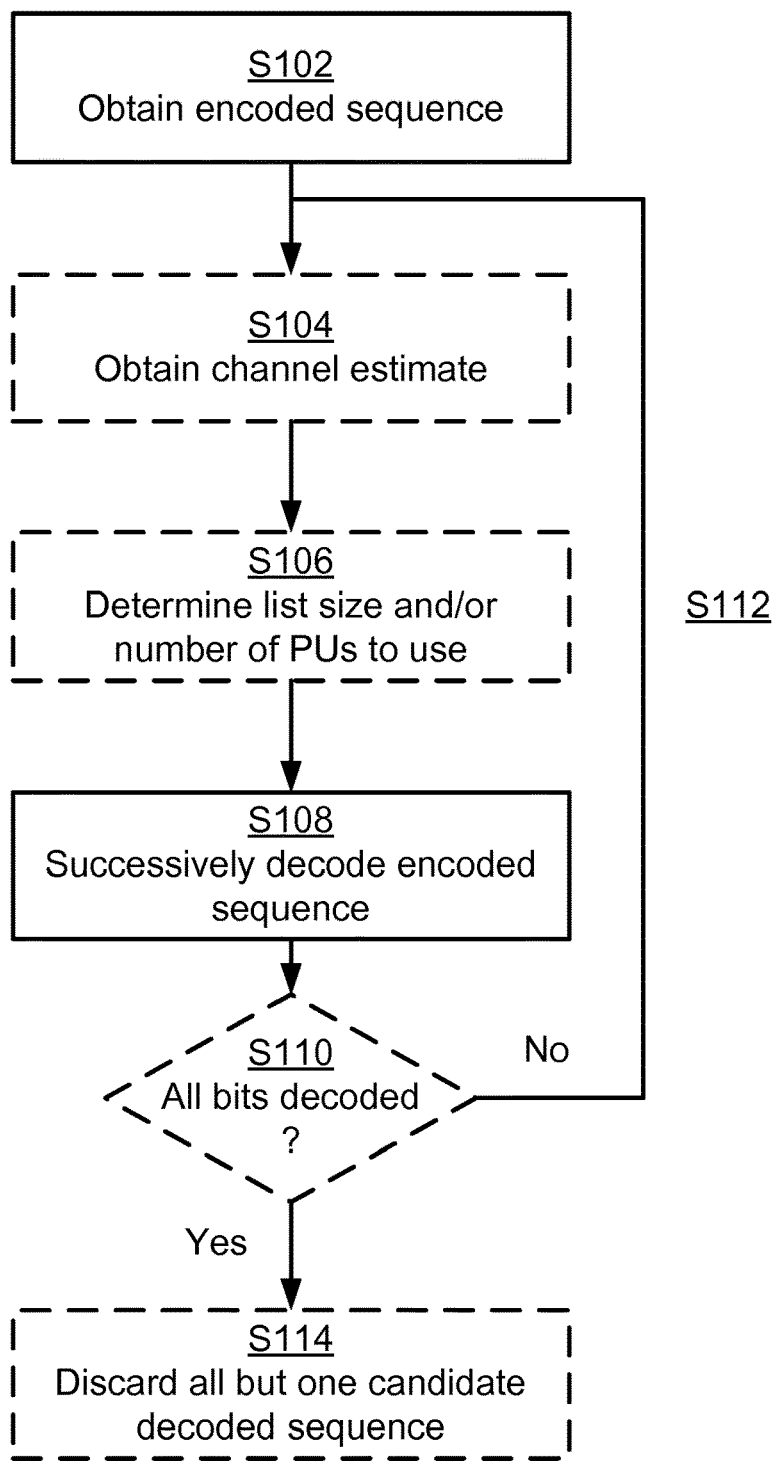
FIG. 4 is a flowchart of methods according to embodiments.

FIG. 4 is a flowchart illustrating embodiments of methods for decoding an encoded sequence ŷ into a decoded sequence ẑ. The methods are performed by the information decoder 200. The methods are advantageously provided as computer programs 920.

S102: The information decoder 200 obtains the encoded sequence ŷ. The encoded sequence ŷ has been encoded using a polar code 300.

S108: The information decoder 200 successively decodes the encoded sequence ŷ into the decoded sequence ẑ.

The successive decoding is based on using a branching criterion to expand a list of candidate decoded sequences with a new candidate decoded sequence. In particular, the decoding is performed for a given list size (LS; where LS>1), defining how many candidate decoded sequences in total the thus far decoded sequence is allowed to branch into during the decoding.

The decoding is thus performed in parallel using a suitable number of processing units (PUs) 210a, 210b, . . . , 210N. All processes (where each process is defined by one of the PUs 210a, 210b, . . . , 210N) are assumed to have their own replica of the decoding problem (as defined by the obtained encoded sequence ŷ), from the outset of the decoding procedure. During the decoding, in the polar code order, each process will branch according to a given branching criterion. In particular, the encoded sequence ŷ is decoded, until its first branching, by at least as many PUs 210a, 210b, . . . , 210N in parallel as a factor (denoted f) of the given list size. The factor is at least half the given list size. That is, $f \geq LS/2$.

In this way, there will not be any need of communication between the different processes (thus, PUs 210a, 210b, . . . , 210N), at least not until all of them have reached the end of the decoding where the full-length candidate decoded sequences are compared and the best one is selected, as will be disclosed below.

Embodiments relating to further details of decoding an encoded sequence ŷ into a decoded sequence ẑ as performed by the information decoder 200 will now be disclosed.

In some aspects the factor f is larger than half the given list size. That is, in some aspects $f>LS/2$. Particularly, according to an embodiment the factor is at least three quarters of the given lists size (that is, $f \geq LS \cdot \frac{3}{4}$), preferably the factor is equal to the give list size (that is, f=LS). In the latter case the encoded sequence ŷ is decoded, until its first branching, by at least as many PUs 210a, 210b, . . . , 210N in parallel as the given list size. However, depending on the lists size there could still be PUs available that are not used for the decoding.

There may be different ways for the information decoder 200 to determine which of the PUs 210a, 210b, . . . , 210N to use for which candidate decoded sequences. In some aspects the information decoder 200 uses a predetermined direction pattern for each PU 210a, 210b, . . . , 210N. Particularly, according to an embodiment each PU 210a, 210b, . . . , 210N has a fixed pattern defining which of the candidate decoded sequences to decode following a next branching of the thus far decoded sequence.

The PUs 210a, 210b, . . . , 210N to perform the decoding are thereby provided with information about what direction to take after each branching and are thereby enabled to perform the decoding without interaction with any other PU 210a, 210b, . . . , 210N (and thus without knowing how many other PUs 210a, 210b, . . . , 210N perform the decoding or how these other PUs 210a, 210b, . . . , 210N select what direction to take after each branching).

In this respect, it might be that no two PUs 210a, 210b, . . . , 210N have the same fixed pattern. But this might depend on how many PUs 210a, 210b, . . . , 210N in total are available for the decoding and how many PUs 210a, 210b, . . . , 210N the information decoder 200 deems necessary to use for the decoding, see step S106 below.

In some aspects each candidate decoded sequence is after branching decoded using its own (subset of) PU(s) 210a, 210b, . . . , 210N. Particularly, according to an embodiment each branching results in two candidate decoded sequences. These two candidate decoded sequences are then decoded in parallel by its own subset of the PUs 210a, 210b, . . . , 210N. Each subset comprises half as many PUs 210a, 210b, . . . , 210N as before each respective branching. Thus, at the end it could be that each subset only comprises one single PU 210a, 210b, . . . , 210N.

There could be different conditions for the information decoder 200 to perform the branching. In some aspects the condition for branching is that a threshold check fails. Hence, according to an embodiment the decoded sequence ẑ is branched into two candidate decoded sequences whenever a threshold check fails. The threshold check is performed on binary digits as they are being decoded.

There could be different strategies as to when, or ow often, the threshold check is to be performed during the decoding.

In some aspects the threshold check is performed only at predetermined (thus, fixed) bit-positions. That is, according to an embodiment the threshold check is performed for binary digits on fixed places as they are being decoded.

In other aspects the threshold check is continuously performed, as in aforementioned international patent application PCT/EP2016/059656. That is, according to an embodiment the threshold check is performed for at least some successive binary digits as they are being decoded.

There could be different examples of threshold checks. In some aspects the threshold check is based on a bit uncertainty criterion. Particularly, according to an embodiment the threshold check, when being performed, evaluates a bit uncertainty criterion of those binary digits that are being decoded. Examples of bit uncertainty criteria will be disclosed below.

There could be different causes of the branching. For example, according to an embodiment the branching is caused by a binary digit for which the threshold check fails having an equal probability of being decoded into a zero and a one during the successive decoding of the encoded sequence ŷ. In this respect the term equal probability can be defined as a probability value of decoding a binary digit to a one being in the interval 0.35-0.65, preferably in the interval 0.4-0.6, more preferably in the interval 0.45-0.55.

Therefore, in some aspects the information decoder 200a determines one probability value for each of the at least some successive binary digits as they are being decoded. Such estimated probabilities can be acquired during the successive decoding of the polar code 300. The bit uncertainty criterion for a given binary digit of said at least some successive binary digits can then be evaluated using this one probability value for this given binary digit. The branching can then be based on various uncertainty metrics of the binary digits that are being decoded.

Each branching causes two separate decoding problems to be created from the parent decoding problem; one with the uncertain bit being set to binary 0 and another with the same uncertain bit set to binary 1. Particularly, according to an embodiment the branching causes a binary digit for which the threshold check fails to be set to binary 0 in a first of the two candidate decoded sequences and set to binary 1 in a second of the two candidate decoded sequences.

There can be different ways to evaluate the bit uncertainty criterion for a given binary digit. For example, the uncertainty criterion can be evaluated using a log-likelihood ratio, entropy, sell-information, or probability measure. The information decoder 200 might therefore be configured to determine at least one of a log-likelihood ratio, entropy, sell-information, or probability measure using the probability value of a given binary digit. The threshold check then fails whenever the absolute value of the log-likelihood ratio, the entropy, the sell-information, or the probability measure is lower than a threshold. Examples of such thresholds will be disclosed next.

For instance, the log-likelihood ratio value $LLR_i$ of a given binary digit at index i represents the certainty of that given binary digit being a binary 0 or a binary 1. If the log-likelihood ratio value is close to zero, which is an indication that the threshold check fails, branching is performed at this given binary digit. Further examples of threshold checks are:

$|LLR_i| \lessapprox \eta$, where $LLR_i$ is the log-likelihood ratio value of the binary digit at index i, where the log-likelihood ratio value are determined $H_i \lessapprox \mu$, where $H_i$ is the entropy value of the binary digit at index i, $I_i \lessapprox \upsilon$, where $I_i$ is the sell-information value of the binary digit at index i.

Here, the notation $\lessapprox$ means that a decision is taken based on a comparison with a threshold. Denote by $p_i$ the probability of the binary digit at index i being decoded into binary 1. The log-likelihood ratio values could then be determined from the estimated probabilities that are acquired in the successive decoding of the polar code, i.e., $$LLR_i = \log\left(\frac{p_i}{1-p_i}\right).$$

The entropy value can be determined assuming a binary symmetric channel, i.e., $H_i = -p_i \log_2 p_i - (1-p_i)\log_2(1-p_i)$. The sell-information can be determined as $I_i = 1 - H_i$.

There may be different ways for the information decoder 200 to determine how many PUs 210a, 210b, ..., 210N to use for decoding the encoded sequence ŷ. In some aspects the channel 120 is a radio propagation channel. Hence, according to an embodiment the encoded sequence ŷ is received over a radio propagation channel 120. How many PUs 210a, 210b, ..., 210N to use for decoding the encoded sequence ŷ might then depend on the channel quality. Hence, according to an embodiment the information decoder 200 is configured to perform (optional) steps S104, S106:

S104: The information decoder 200 obtains a channel estimate of the radio propagation channel 120. Different ways to obtain channel estimates of a radio propagation channel 120 are known to the skilled person.

S106: The information decoder 200 determines at least one of the list size and how many PUs 210a, 210b, ..., 210N to decode the encoded sequence ŷ until its first branching based on the channel estimate. In this respect, the worse the channel quality is, the higher number of PUs 210a, 210b, ..., 210N are used (and the larger the list size is) to decode the encoded sequence ŷ until its first branching.

After the successive decoding in step S108 has been completed, the information decoder 200 can be configured to select the candidate decoded sequence which has the highest probability of being correct (by for instance accumulating the probabilities over the binary digits in that candidate decoded sequence). Hence, according to an embodiment the information decoder 200 is configured to perform steps S110, S112 and S114 after having performed step S104 (and optionally, steps S106, S108):

S110: The information decoder 200 checks if all binary digits of the encoded sequence ŷ have been decoded. If no, step S112 is entered. If yes, step S114 is entered.

S112: The information decoder 200 repeats the successively decoding (in step S104, and optionally, steps S106, S108) until all binary digits of the encoded sequence ŷ have been decoded. This results in at least two candidate decoded sequences.

S114: The information decoder 200 discards all but one of the at least two candidate decoded sequences, resulting in one single decoded sequence ẑ.

After the list decoding is performed, the information decoder 200 can thereby select the candidate sequence which has the highest probability of being correct. There could be different ways for the information decoder 200 to discard all but one of the at least two candidate decoded sequences will now be disclosed. In some aspects the information decoder accumulates the probabilities over the binary digits in the candidate decoded sequences. In some aspects the information decoder 200 performs a cyclic redundancy check at the end. This can be an even more confident way of picking a single candidate decoded sequence amongst a plurality of candidate decoded sequences.

Figure 5:
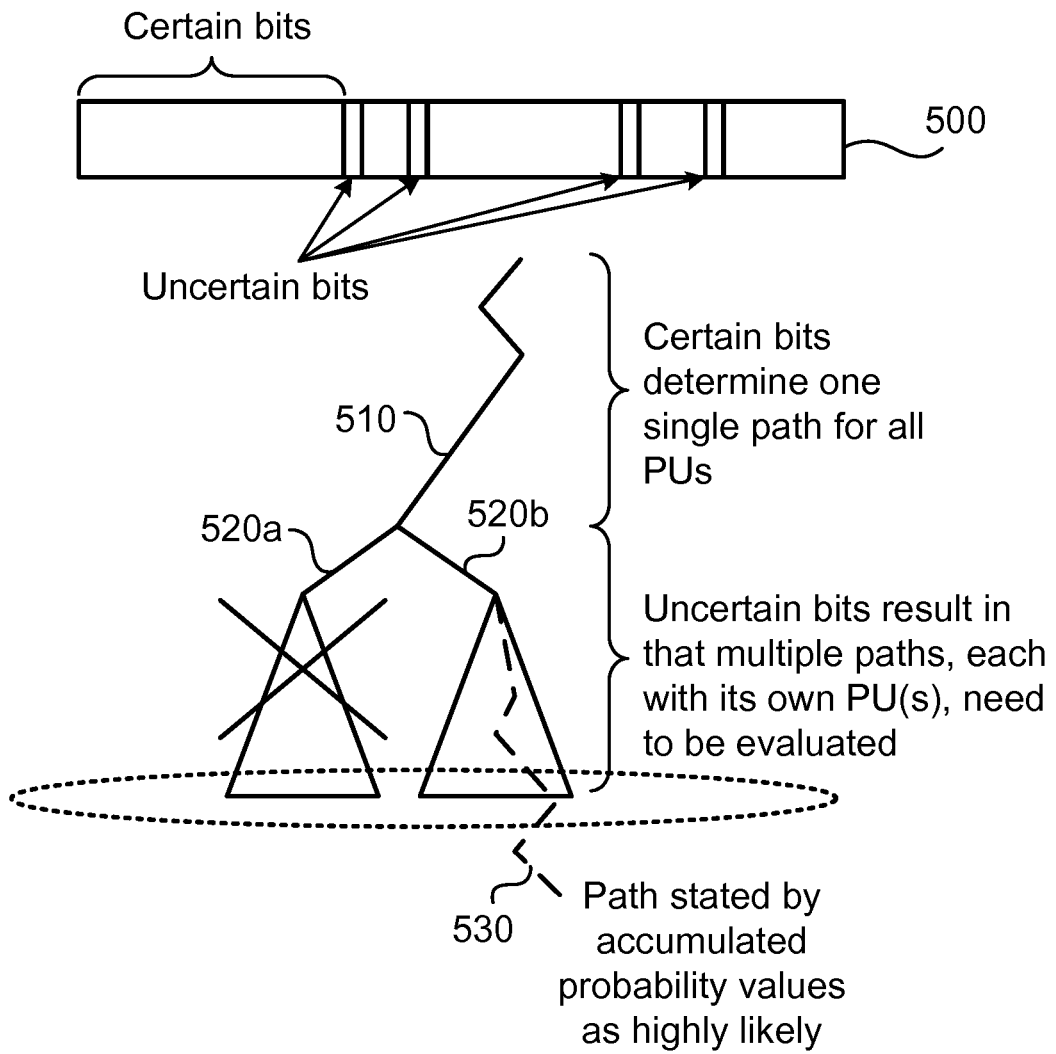
FIG. 5 is a schematic diagrams illustrating list decoding according to embodiments.

FIG. 5 shows a general illustration of list decoding of a polar code 300 wherein a sequence of uncertain binary digits may result in sub-trees of candidate decoded sequences. In more detail, FIG. 5 at 500 illustrates a sequence of the encoded sequence that is being decoded. At the outset, the sequence is decoded by all PUs 210a, 210b, ..., 210N in parallel. For some of the binary digits the threshold check is successful and these binary digits are identified as fixed bits. As disclosed above, the bit-positions where the threshold check is performed could be fixed. Alternatively, the threshold check is performed is continuously performed, and thus performed at each of the bit-positions. A successive sequence of such fixed bits defines one path 510. For some of the binary digits the threshold check fails and these binary digits are identified as uncertain bits. For each failure of the threshold check a branching of the decoded sequence into two candidate decoded sequences is performed, resulting in multiple paths 520a, 520b for the uncertain bits needed to be evaluated. Each such path 520a, 520b is decoded using its own subset of the PUs 210a, 210b, . . . , 210N. At the end of the decoding, one path 530 of the multiple paths 520a, 520b is selected, based on having accumulated probability values as highly likely (in comparison to all other candidate decoded sequences), to represent the decoded sequence, as in step S114.

As a further illustrative example, assume a polar code 300 of length 128 and an information decoder 200 using a list size of four, i.e. LS=4. Assume further that there are four PUs (denoted PU1, PU2, PU3, PU4, respectively) available to process the candidate decoded sequences in parallel. Assume further that, according to the branching criterion used and the encoded sequence ŷ, the first branching will occur at bit-position 27. Assume further that the branching criterion is such that the information decoder 200 will only know this once it is at this bit-position. That will create two branches from bit-position 27 and onwards; one with the bit at position 27 set to binary 1 and the other with the bit at position 27 set to binary 0.

All four PUs will then decode the same partial codeword up to bit-position 27. Once bit-position 27 is reached, two of the PUs (say, PU1, PU2) will continue decoding the candidate decoded sequence whose bit at bit-position 27 is set to binary 1 (for illustrative purposes denoted the left pair) and the other two PUs (say, PU3, PU4) will continue decoding the candidate decoded sequence whose bit at bit-position 27 is set to binary 0 (for illustrative purposes denoted the right pair).

Figure 6:
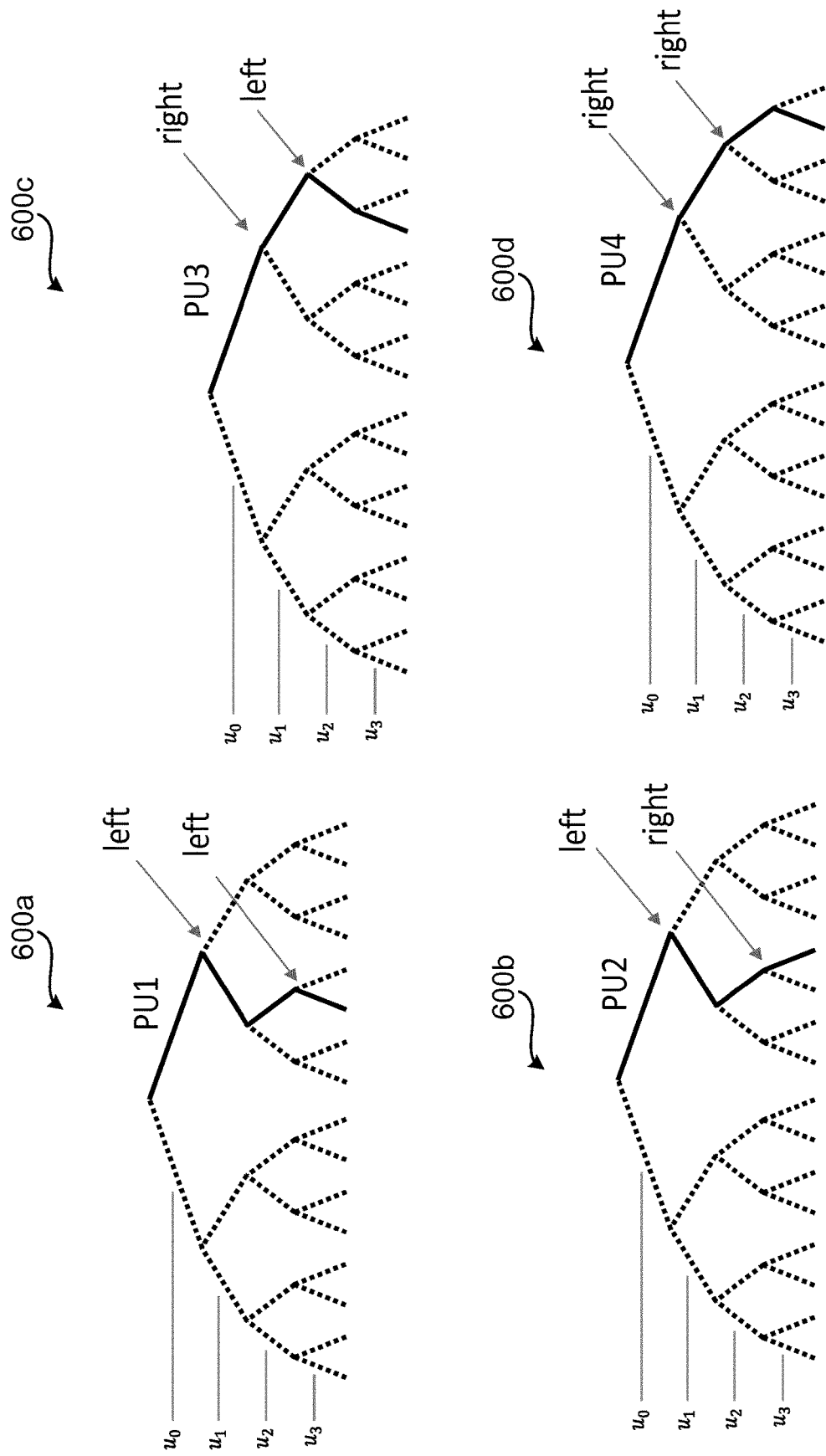
FIG. 6 is a schematic diagrams illustrating use of processing units for list decoding according to embodiments.

Assume further that the branching criterion will cause the left pair to next branch at bit-position 43 and the right pair to next branch at bit-position at bit-position 51. Then one of the PUs (say, PU1) of the left pair will set the bit at bit-position 43 to binary 1 and the other PU (say, PU2) of the left pair will set the bit at bit-position 43 to binary 0. PU1 and PU2 will then continue to decode the remainder of their respective candidate decoded sequence. Analogously, one of the PUs (say, PU3) of the right pair is assumed to, according to the branching criterion, will set the bit at bit-position 51 to binary 1 and the other PU (say, PU4) of the right pair will set the bit at bit-position 51 to binary 0. PU3 and PU4 will then continue to decode the remainder of their respective candidate decoded sequence. In this illustrative example the predetermined direction patterns of the PUs is hence PU1: [left, left], PU2: [left, right], PU3: [right, left], and PU4: [right, right]. This is schematically illustrated in FIG. 6 which at 600a illustrates the direction pattern of PU1, at 600b illustrates the direction pattern of PU2, at 600c illustrates the direction pattern of PU3, and at 600d illustrates the direction pattern of PU4 for branching occurring at bit-positions $u_0$, $u_1$, $u_2$, and $u_3$.

Figure 7:
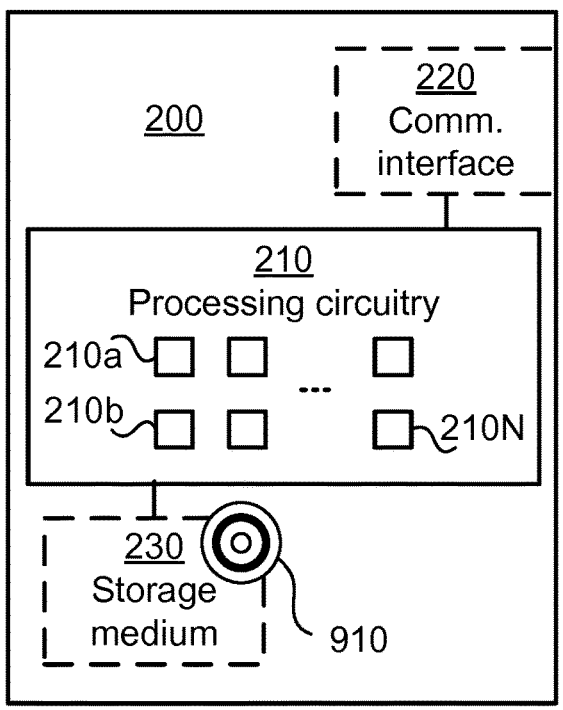
FIG. 7 is a schematic diagram showing functional units of an information decoder according to an embodiment.

FIG. 7 schematically illustrates, in terms of a number of functional units, the components of an information decoder 200 according to an embodiment. Processing circuitry 210 is provided using any combination of one or more of a suitable central processing unit (CPU), multiprocessor, microcontroller, digital signal processor (DSP), etc., capable of executing software instructions stored in a computer program product 910 (as in FIG. 9), e.g. in the form of a storage medium 230. The processing circuitry 210 may further be provided as at least one application specific integrated circuit (ASIC), or field programmable gate array (FPGA). In particular, the processing circuitry 210 is assumed to comprise N processing units 210a-210N, where N>1.

Particularly, the processing circuitry 210 is configured to cause the information decoder 200 to perform a set of operations, or steps, S102-S114, as disclosed above. For example, the storage medium 230 may store the set of operations, and the processing circuitry 210 may be configured to retrieve the set of operations from the storage medium 230 to cause the information decoder 200 to perform the set of operations. The set of operations may be provided as a set of executable instructions.

Thus the processing circuitry 210 is thereby arranged to execute methods as herein disclosed. The storage medium 230 may also comprise persistent storage, which, for example, can be any single one or combination of magnetic memory, optical memory, solid state memory or even remotely mounted memory. The information decoder 200 may further comprise a communications interface 220 at least configured for communications with an information encoder 110. As such the communications interface 220 may comprise one or more transmitters and receivers, comprising analogue and digital components. The processing circuitry 210 controls the general operation of the information decoder 200 e.g. by sending data and control signals to the communications interface 220 and the storage medium 230, by receiving data and reports from the communications interface 220, and by retrieving data and instructions from the storage medium 230. Other components, as well as the related functionality, of the information decoder 200 are omitted in order not to obscure the concepts presented herein.

Figure 8:
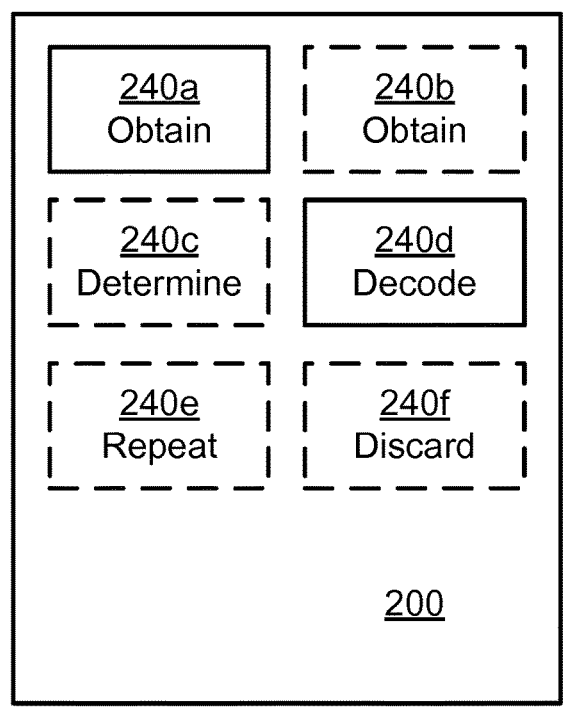
FIG. 8 is a schematic diagram showing functional modules of an information decoder according to an embodiment.

FIG. 8 schematically illustrates, in terms of a number of functional modules, the components of an information decoder 200 according to an embodiment. The information decoder 200 of FIG. 8 comprises a number of functional modules; an obtain module 240a configured to perform step S102 and a decode module 240d configured to perform step S108. The information decoder 200 of FIG. 8 may further comprise a number of optional functional modules, such as any of an obtain module 240b configured to perform step S104, a determine module 240c configured to perform step S106, a repeat module 240e configured to perform step S112, and a discard module 240f configured to perform step S114.

In general terms, each functional module 240a-240f may in one embodiment be implemented only in hardware and in another embodiment with the help of software, i.e., the latter embodiment having computer program instructions stored on the storage medium 230 which when run on the processing circuitry makes the information decoder 200 perform the corresponding steps mentioned above in conjunction with FIG. 7. It should also be mentioned that even though the modules correspond to parts of a computer program, they do not need to be separate modules therein, but the way in which they are implemented in software is dependent on the programming language used. Preferably, one or more or all functional modules 240a-240f may be implemented by the processing circuitry 210, possibly in cooperation with the communications interface 220 and/or the storage medium 230. The processing circuitry 210 may thus be configured to from the storage medium 230 fetch instructions as provided by a functional module 240a-240f and to execute these instructions, thereby performing any steps as disclosed herein.

The information decoder 200 may be provided as a standalone device or as a part of at least one further device. For example, the information decoder 200 may be provided in a radio access network node (such as in a radio base station, a base transceiver station, a node B, or an evolved node B) or in an end-user device (such as in a portable wireless device, a mobile station, a mobile phone, a handset, a wireless local loop phone, a user equipment (UE), a smartphone, a laptop computer, a tablet computer, a sensor device, an Internet of Things device, or a wireless modem).

Thus, a first portion of the instructions performed by the information decoder 200 may be executed in a first device, and a second portion of the of the instructions performed by the information decoder 200 may be executed in a second device; the herein disclosed embodiments are not limited to any particular number of devices on which the instructions performed by the information decoder 200 may be executed. Hence, the methods according to the herein disclosed embodiments are suitable to be performed by an information decoder 200 residing in a cloud computational environment. Therefore, the processing circuitry 210 may be distributed among a plurality of devices, or nodes. The same applies to the functional modules 240a-240f of FIG. 8 and the computer program 920 of FIG. 9 (see below).

Figure 9:
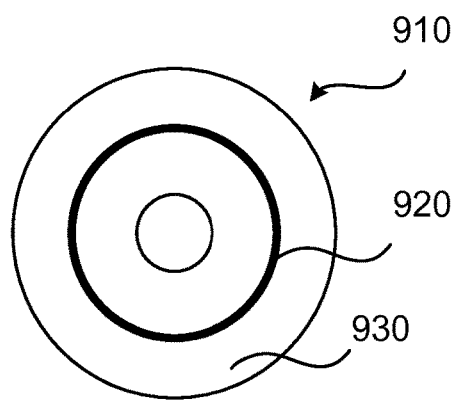
FIG. 9 shows one example of a computer program product comprising computer readable storage medium according to an embodiment.

FIG. 9 shows one example of a computer program product 910 comprising computer readable storage medium 930. On this computer readable storage medium 930, a computer program 920 can be stored, which computer program 920 can cause the processing circuitry 210 and thereto operatively coupled entities and devices, such as the communications interface 220 and the storage medium 230, to execute methods according to embodiments described herein. The computer program 920 and/or computer program product 910 may thus provide means for performing any steps as herein disclosed.

In the example of FIG. 9, the computer program product 910 is illustrated as an optical disc, such as a CD (compact disc) or a DVD (digital versatile disc) or a Blu-Ray disc. The computer program product 910 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 920 is here schematically shown as a track on the depicted optical disk, the computer program 920 can be stored in any way which is suitable for the computer program product 910.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A method for decoding an encoded sequence into a decoded sequence, the method comprising an information decoder:
   obtaining the encoded sequence, the encoded sequence having been encoded using a polar code; and
   successively decoding the encoded sequence into the decoded sequence;
   wherein the decoding is performed for a given list size (LS) defining how many candidate decoded sequences in total the thus far decoded sequence is allowed to branch into during the decoding, wherein LS>1; and
   wherein the encoded sequence is decoded, until its first branching, by at least as many processing units (PUs) in parallel as a factor of the given list size; wherein the factor is at least half the given list size.

2. The method of claim 1, wherein each PU has a fixed pattern defining which of the candidate decoded sequences to decode following a next branching of the thus far decoded sequence.

3. The method of claim 2, wherein no two PUs have the same fixed pattern.

4. The method of claim 1:
   wherein each branching results in two candidate decoded sequences;
   wherein the two candidate decoded sequences are decoded in parallel by a respective subset of the PUs; and
   wherein each subset comprises half as many PUs as before the each branching.

5. The method of claim 4, wherein the decoded sequence is branched into two candidate decoded sequences whenever a threshold check fails, the threshold check being performed on binary digits as being decoded.

6. The method of claim 5, wherein the threshold check is performed for binary digits on fixed places as being decoded.

7. The method of claim 5, wherein the threshold check is performed for at least some successive binary digits as being decoded.

8. The method of claim 6, wherein the threshold check, when being performed, evaluates a bit uncertainty criterion of those binary digits that are being decoded.

9. The method of claim 5, wherein the branching is caused by a binary digit for which the threshold check fails having an equal probability of being decoded into a zero and a one during the successive decoding of the encoded sequence.

10. The method of claim 5, wherein the branching causes a binary digit for which the threshold check fails to be set to binary 0 in a first of the two candidate decoded sequences, and set to binary 1 in a second of the two candidate decoded sequences.

11. The method of claim 1:
   wherein the encoded sequence is received over a radio propagation channel;
   wherein the method comprises:
      obtaining a channel estimate of the radio propagation channel; and
      determining the list size and/or how many PUs to decode the encoded sequence until its first branching based on the channel estimate.

12. The method of claim 1, further comprising:
   repeating the successive decoding until all binary digits of the encoded sequence have been decoded, resulting in at least two candidate decoded sequences; and
   discarding all but one of the at least two candidate decoded sequences, resulting in one single decoded sequence.

13. The method of claim 1, wherein the factor is at least three quarters of the given lists size.

14. An information decoder for decoding an encoded sequence into a decoded sequence, the information decoder comprising:
   processing circuitry;
   memory containing instructions executable by the processing circuitry whereby the information decoder is operative to:

obtain the encoded sequence, the encoded sequence having been encoded using a polar code; and successively decode the encoded sequence into the decoded sequence;

wherein the decoding is performed for a given list size (LS) defining how many candidate decoded sequences in total the thus far decoded sequence is allowed to branch into during the decoding, wherein LS>1; and wherein the encoded sequence is decoded, until its first branching, by at least as many processing units (PUs) in parallel as a factor of the given list size; wherein the factor is at least half the given list size.

15. The information decoder of claim 14:

wherein each branching results in two candidate decoded sequences;

wherein the instructions are such the information decoder is operative to decode the two candidate decoded sequences in parallel by a respective subset of the PUs; and wherein each subset comprises half as many PUs as before the each branching.

16. The information decoder of claim 15, wherein the instructions are such the information decoder is operative to branch the decoded sequence into two candidate decoded sequences whenever a threshold check fails, the threshold check being performed on binary digits as being decoded.

17. The information decoder of claim 16, wherein the instructions are such the information decoder is operative to perform the threshold check for binary digits on fixed places as being decoded.

18. The information decoder of claim 16, wherein the instructions are such the information decoder is operative to perform the threshold check for at least some successive binary digits as being decoded.

19. The information decoder of claim 17, wherein the instructions are such the information decoder is operative to, when performing the threshold check, evaluate a bit uncertainty criterion of those binary digits that are being decoded.

20. A non-transitory computer readable recording medium storing a computer program product for controlling an information decoder to decode an encoded sequence into a decoded sequence, the computer program product comprising program instructions which, when run on processing circuitry of the information decoder, causes the information decoder to:

obtain the encoded sequence, the encoded sequence having been encoded using a polar code; and successively decode the encoded sequence into the decoded sequence;

wherein the decoding is performed for a given list size (LS) defining how many candidate decoded sequences in total the thus far decoded sequence is allowed to branch into during the decoding, wherein LS>1; and wherein the encoded sequence is decoded, until its first branching, by at least as many processing units (PUs) in parallel as a factor of the given list size; wherein the factor is at least half the given list size.

* * * * *